US012681053B2

(12) United States Patent　　　　(10) Patent No.:　US 12,681,053 B2

Hein et al.　　　　　　　　　　　　(45) Date of Patent:　　　Jul. 14, 2026

(54) INTEGRATED CIRCUIT PIN FOR REFERENCE VOLTAGE AND FAULT COMMUNICATION

(71) Applicant: Allegro MicroSystems, LLC, Manchester, NH (US)

(72) Inventors: Matthew Hein, Dallas, TX (US); Benjamin Damkroger, Dallas, TX (US)

(73) Assignee: Allegro MicroSystems, LLC, Manchester, NH (US)

( * ) Notice: Subject to any disclaimer, the term of this patent is extended or adjusted under 35 U.S.C. 154(b) by 170 days.

(21) Appl. No.: 18/430,740

(22) Filed: Feb. 2, 2024

(65) Prior Publication Data

US 2025/0251430 A1　　Aug. 7, 2025

(51) Int. Cl.
　　G01R 19/165　　(2006.01)
　　G01R 15/20　　(2006.01)
　　H02H 3/08　　(2006.01)
(52) U.S. Cl.
　　CPC ....... G01R 19/16571 (2013.01); G01R 15/20 (2013.01); H02H 3/08 (2013.01)
(58) Field of Classification Search
　　CPC ........ G01R 31/08; G01R 31/28; G01R 31/50; G01R 31/52; G01R 31/346; G01R 31/62; G01R 31/72; G01R 19/16571; G01R 15/20; H02H 3/08; H02H 3/087
　　USPC ........ 324/512, 117 H, 117 R, 509, 522, 546, 324/126
　　See application file for complete search history.

(56) References Cited

U.S. PATENT DOCUMENTS

| | | | |
|---|---|---|---|
| 7,552,016 B2 | 6/2009 | Vig et al. | |
| 7,573,393 B2 | 8/2009 | Haas et al. | |
| 8,054,071 B2 | 11/2011 | Doogue et al. | |
| 8,085,516 B1 * | 12/2011 | Armstrong ............. | H02H 3/335 |
| | | | 361/45 |
| 8,122,159 B2 | 2/2012 | Monreal | |
| 9,383,425 B2 | 7/2016 | Milano et al. | |
| 10,634,735 B2 | 4/2020 | Kravljaca et al. | |
| 11,194,004 B2 | 12/2021 | Scheller et al. | |
| 11,519,946 B1 | 12/2022 | Rock et al. | |
| 11,555,832 B2 | 1/2023 | Friedrich et al. | |
| 11,768,229 B2 | 9/2023 | Boden et al. | |
| 2017/0331270 A1 * | 11/2017 | Mattos ................. | H02H 1/0007 |
| 2018/0136999 A1 * | 5/2018 | Fernandez .......... | G06F 11/0739 |
| 2022/0034684 A1 * | 2/2022 | Le Goff .............. | G01D 5/2073 |
| 2022/0294204 A1 * | 9/2022 | Ostrovsky ................ | H02H 3/20 |
| 2023/0060219 A1 | 3/2023 | Liu et al. | |

(Continued)

OTHER PUBLICATIONS

U.S. Appl. No. 18/354,709, filed Jul. 19, 2023, Hein, et al.

(Continued)

*Primary Examiner* — Roberto Velez

(74) *Attorney, Agent, or Firm* — DALY, CROWLEY, MOFFORD & DURKEE, LLP

(57)　　　　　ABSTRACT

A sensor integrated circuit includes a sensing circuit configured to generate the sensor output signal and a fault circuit to detect a fault and generate a fault signal indicative of the fault. A combined signal indicative of the fault signal when a fault is detected and indicative of a reference voltage associated with the sensor IC at other times is provided at a shared connection of the sensor IC. Embodiments include a current sensor IC and fault detectors configured to detect one or more faults.

22 Claims, 4 Drawing Sheets

(56)                    References Cited

U.S. PATENT DOCUMENTS

2023/0221355 A1    7/2023  Liu
2024/0047314 A1    2/2024  Briano et al.

OTHER PUBLICATIONS

Allegro MicroSystems, LLC Datasheet "AC837010 and ACS37012 450 kHz, High Accuracy Current Sensor with FAULT or Reference Output in SOIC-6 Package", Nov. 9, 2023, 26 pages.

* cited by examiner

INTEGRATED CIRCUIT PIN FOR REFERENCE VOLTAGE AND FAULT COMMUNICATION

BACKGROUND

As is known, sensors are used to perform various functions in a variety of applications. Some sensors include one or more magnetic field sensing elements, such as a Hall effect element or a magnetoresistance (MR) element, to sense a magnetic field associated with a target object. Magnetic field sensor applications include, but are not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a linear magnetic field sensor that senses a magnetic field strength or density of a magnetic field.

The sensor output signal can be provided in various formats. For example, some sensors communicate with an external controller with a two-wire, current level protocol with which the sensor power connections are used to communicate data by applying discrete current levels to the power connections. Other sensors communicate with an external controller through a three-wire interface in which a dedicated connection is provided to communicate data as a voltage level that can be proportional to the sensed parameter. Still other sensors, such as current transducers, provide an output signal in the form of an analog current level (i.e., a current output signal that is proportional to a sensed parameter).

Many sensors include fault detection circuitry with which certain faults, failures, or errors can be detected and resulting fault information can be reported to an external controller through a fault pin. As one example, current sensors often include circuitry to detect an overcurrent condition.

Some sensors provide a sensor reference voltage indicative of the quiescent sensor output signal, sometimes referred to as a VREF voltage, to an external controller through a VREF pin. The external controller can make a differential measurement based on a difference between the sensor output signal and the reference voltage. Such differential measurements can provide improved accuracy and noise immunity.

Sensors often take the form of integrated circuits (ICs). Providing sensors with fewer external connections, or pins, can be advantageous due to tight space constraints in many electronic systems. Furthermore, additional pins can increase the overall cost of the sensor due to a larger IC package required. However, a requirement for fewer external connections based on the IC package type can require sacrificing sensor functionality.

SUMMARY

The present disclosure is directed to circuits and methods for providing a combined signal indicative of both fault information and reference voltage information at shared connection of a sensor IC. Use of a single pin for dual fault and reference voltage functionality permits the sensor IC to have the same number of external connections as other sensors ICs, while providing additional functionality of providing both reference voltage information and fault information. Or alternatively permits the sensor IC to have fewer external connections than other sensor ICs that provide the same functionality.

According to the disclosure, a sensor integrated circuit configured to generate a sensor output signal indicative of a sensed parameter includes a power connection configured to receive a supply voltage, a ground connection, a sensing circuit configured to generate the sensor output signal at a sensor output signal connection, wherein the sensing circuit has a reference voltage, a fault circuit comprising a fault detector configured to detect a fault and generate a fault signal indicative of the fault, and a combined connection at which a combined signal is provided, wherein the combined signal is indicative of the fault signal and the reference voltage.

Features may include one or more of the following individually or in combination with other features. The sensor integrated circuit can further include a reference buffer coupled to receive the reference voltage. The fault detector can be further configured to generate a disable signal coupled to the reference buffer and configured to disable the reference buffer when a fault is detected. The fault signal can be a digital signal having a low level when a fault is detected. The fault circuit can include a pull-down transistor controlled by the fault signal and configured to pull the combined signal to the low level when the fault is detected. The fault can be a first fault and the fault detector can be further configured to detect a second fault, and wherein the fault circuit further includes a push-pull circuit controlled by the fault signal and configured to pull the combined signal to the low level when the first fault is detected and pull the combined signal to a high level when the second fault is detected. The fault can be an overcurrent condition. The sensed parameter can be a current flow through a conductor and the overcurrent condition can be an overcurrent condition of the current flow through the conductor. The sensing circuit can include a sensing element configured to generate a sensing element output signal and a processing path responsive to the sensing element output signal and configured to generate the sensor output signal. The sensing element can include a magnetic field sensing element and the sensed parameter can be a magnetic field. The processing path can include a front-end amplifier coupled to receive the sensing element output signal and configured to generate an amplifier output signal. The reference voltage can be at a voltage level of approximately one-half the supply voltage. The combined connection can be configured for coupling to an external buffer or an external inverter to generate a level-shifted combined signal.

According to a further aspect of the disclosure, a method includes generating a sensor output signal indicative of a sensed parameter at a sensor output signal connection with a sensing circuit having a reference voltage, generating a fault signal indicative of a fault being detected, and generating a combined signal indicative of the reference voltage and the fault signal.

Features may include one or more of the following individually or in combination with other features. The method can further include buffering the reference voltage with a reference buffer. The method can further include disabling the reference buffer when the fault is detected. Generating the fault signal can include generating a low level signal when the fault is detected. Generating the combined signal can include pulling the combined signal to the low level when a fault is detected. Generating the fault signal can include generating the fault signal indicative of a first fault or a second fault and generating the combined signal can include pulling the combined signal to the low level when the first fault is detected and pulling the combined signal to a high level when the second fault is detected. The fault can include an overcurrent condition. The sensed parameter can be a magnetic field associated with a current flow through a conductor and generating the sensor output signal comprises sensing the magnetic field with a magnetic field sensing element.

BRIEF DESCRIPTION OF DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
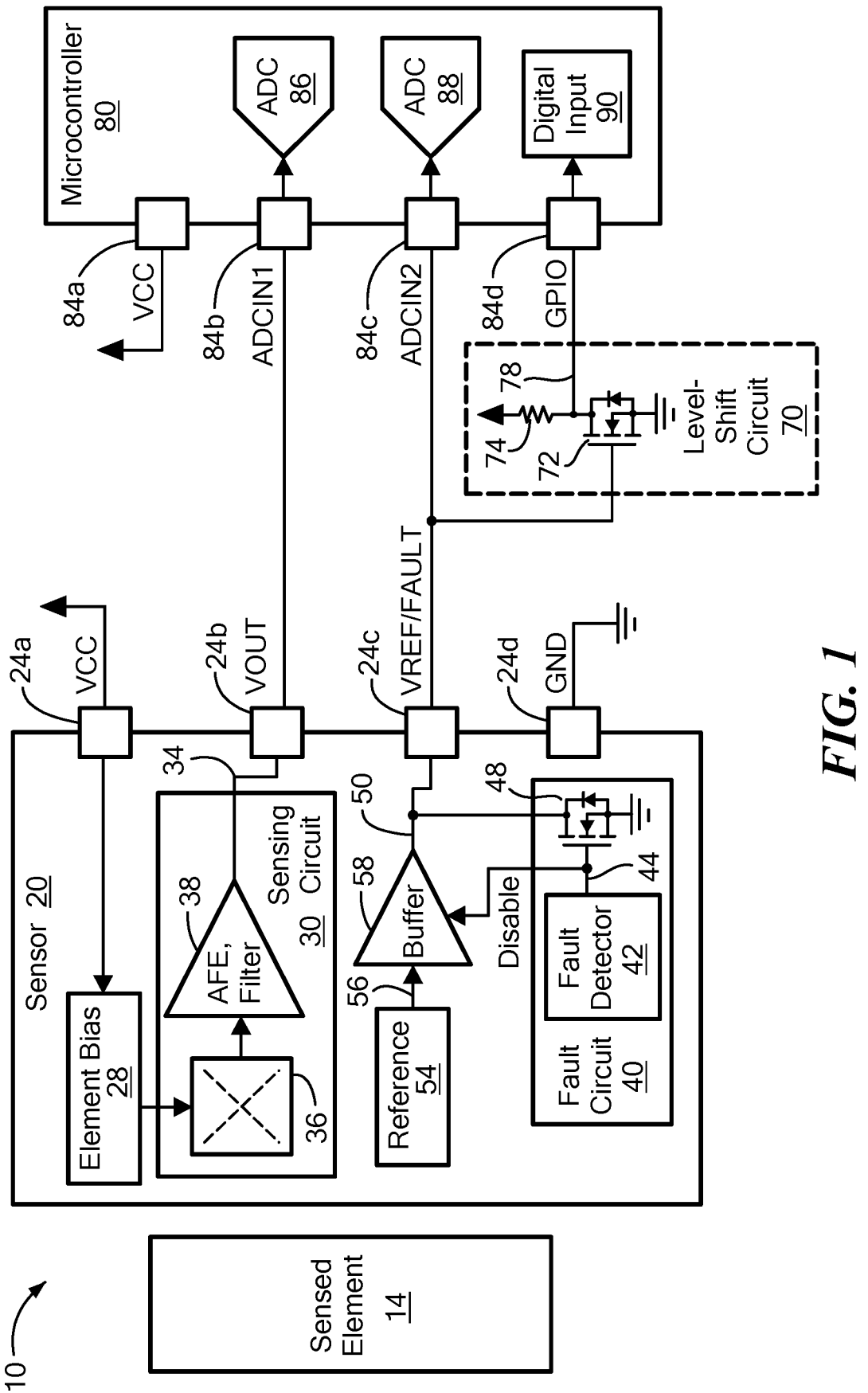
FIG. 1 is a block diagram of a sensor system including a sensor having a combined fault signal and reference voltage connection according to the disclosure.

Referring to FIG. 1, a sensor system 10 includes a sensor integrated circuit (IC) 20 configured to generate a sensor output signal 34 indicative of a sensed parameter. The sensor IC 20 includes a power connection 24*a* configured to receive a supply voltage VCC, a ground connection 24*d*, and a sensing circuit 30. Sensing circuit 30 has a reference voltage VREF represented by block 54 and is configured to generate the sensor output signal 34 at a sensor output connection VOUT 24*b*. A fault circuit 40 includes a fault detector 42 configured to detect a fault and generate a fault signal 44 indicative of the fault.

According to the disclosure, a combined signal 50 indicative of both the fault signal 44 and the reference voltage 56 is provided at shared connection VREF/FAULT 24*c* of the IC 20. Use of a single pin 24*c* for the dual functionality of communicating reference voltage as well as fault information advantageously permits the sensor IC 20 to have the same number of external connections as other sensors ICs, while providing additional functionality of providing both reference voltage information and fault information. Or stated differently, the described arrangement permits the sensor IC 20 to have fewer external connections than other sensor ICs that provide the same functionality.

Sensor IC 20 is configured to sense a parameter associated with a target 14 and can take various forms utilizing various types of sensing elements. Example sensor IC 20 is a magnetic field sensor including one or more magnetic field sensing elements 36, such as a Hall effect element or a magnetoresistance (MR) element, to sense a magnetic field associated with target 14. It will be appreciated by those of ordinary skill in the art however that other sensing methodologies and sensing element types are possible, including but not limited to a resistive element as may be configured to generate a voltage signal indicative of a current flow through a conductor, an optical sensing element, or a pressure sensing element.

Example sensor IC 20 is a magnetic field current sensor configured to measure a current through a conductor 14. More generally however, magnetic field sensor IC 20 could be configured for various applications including, but not limited to an angle sensor in which the sensed parameter is an angle of a direction of a magnetic field, a magnetic switch in which the sensed parameter is proximity of a ferromagnetic object, a rotation detector in which the sensed parameter is rotation speed and/or direction of articles, for example, magnetic domains of a ring magnet or a ferromagnetic target (e.g., gear teeth) where the magnetic field sensor is used in combination with a back-biased or other magnet, or a linear magnetic field sensor in which the sensed parameter is a magnetic field strength or density of a magnetic field.

While sensor IC 20 is described herein as a magnetic field current sensor, it will be appreciated by those of ordinary skill in the art that sensor IC 20 is not limited to any particular sensor type. In general, the combined signal 50 and shared connection 24*c* described herein can be advantageous for use with any sensor having an analog output and a fault detector.

In example magnetic field current sensor IC 20, sensing circuit 30 is configured to measure a current through conductor 14. To this end, sensing circuit 30 can include one or more sensing elements 36 coupled to processing circuitry 38. Sensing elements 36 can take a variety of forms, such as Hall effect elements or magnetoresistance elements as non-limiting examples, and a bias circuit 28 can be configured to provide bias current to the sensing elements 36. Sensing elements 36 may be arranged in one or more bridge or other configurations in order to generate one or more single-ended or differential signals indicative of the sensed magnetic field.

Processing circuitry 38 may include a front-end amplifier and/or a filter. Sensor output signal 34 can be an analog signal. In the context of current sensor IC 20, sensor output signal 34 can have a voltage level indicative of the current through conductor 14. It will be appreciated by those of ordinary skill in the art that processing circuitry 38 may include other circuitry suited to the sensor application.

Conductor 14 can be an integrated conductor as may include leads of a lead frame of the sensor IC 20 or conductor 14 can be an external conductor, such as a bus bar or traces of a substrate such as a printed circuit board, in which case sensor IC 20 is positioned in proximity to the conductor.

The sensor IC 20 can be packaged in a package of various forms, such as an SOIC-8 package with four pins, as illustrated. It will be appreciated by those of ordinary skill in the art however, that the sensor IC package is not limited to any particular package type with any particular number of connections in order to still benefit from the described dual purpose VREF/FAULT connection 24*c*.

Reference voltage block 54 can generate a reference voltage 56 indicative of the quiescent voltage output for the sensor output VOUT. Reference voltage 56 can be buffered by a buffer 58. Generally, the reference voltage 56 is one-half of the VCC supply voltage level. For example, the nominal reference voltage level can be 1.65V in the case of a nominal VCC voltage of 3.3V or can be 2.5V in the case of a nominal VCC voltage of 5.0V.

Fault circuit 40 can be configured to detect various faults. Example faults include, but are not limited to overcurrent, overtemperature, safety diagnostic failure, etc.

In example current sensor IC 20, fault circuit 40 includes a fault detector 42 that can be a bidirectional overcurrent detector. In the example in which the sensed element 14 is a current conductor, fault detector 42 can detect a current level through conductor 14 that is greater than a predetermined positive current or less than a predetermined negative current. Thus, the fault signal 44 trips symmetrically for positive and negative currents exceeding the predetermined threshold. The predetermined threshold can be preset or user programmed. For example, the sensor IC 20 may utilize a test mode such as via Manchester communication to configure the fault condition such as the predetermined overcurrent tripping threshold.

Various fault detector circuitry and methodologies are suitable for providing the fault signal 44. In an example, fault detector 42 can include a window comparator coupled to receive the sensor output signal 34 at a first input and the predetermined threshold at a second input and an output of the window comparator can change state when the sensor output signal 34 exceeds or falls below the predetermined threshold. Thus, it will be appreciated by those of ordinary skill in the art that the fault circuit 40 and fault detector 42 are not limited to any particular type or topology of fault detection circuitry.

In "normal" operation, when there is no fault detected by fault detector 42, the combined signal 50 at shared output 24c provides the reference voltage VREF. In other words, when the sensor IC 20 is operating normally, the VREF/FAULT pin 24c will output the sensor reference voltage VREF which is typically a voltage of approximately VCC/2.

In the case of a fault condition, such as an overcurrent or short circuit condition, the reference buffer 58 is disabled and the VREF/FAULT pin 24c is pulled down. For example, when a fault occurs and is detected by detector 42, fault signal 44 can be provided to buffer 58 in order to disable the buffer. Also, the fault signal 44 causes the combined signal 50 to be pulled low, to ground to thereby indicate the presence of a fault. In the example embodiment, the fault signal 44 turns on a pull-down transistor 48, such as the illustrated NMOS transistor. In this way, the overcurrent fault detector 42 operates to pull the open-drain combined VREF/FAULT pin 24c low when the current through conductor 14 exceeds a predetermined threshold.

It will be appreciated by those of ordinary skill in the art that disabling the reference buffer 58 can prevent unnecessary power dissipation associated with the buffer sinking current to ground and/or preventing damage to the buffer depending on the buffer design.

System 10 can further include an external microcontroller 80 with which sensor IC 20 communicates. Microcontroller 80 has a power connection 84a configured to receive a supply voltage VCC and connections 84b, 84c, 84d configured to communicate with sensor IC 20.

Microcontroller 80 is configured to receive sensor output signal 34 at an ADCIN1 connection 84b and to receive the combined VREF/FAULT signal 50 at an ADCIN2 connection 84c. An ADC 86 coupled to the ADCIN1 connection 84b can convert the received sensor output signal 34 into a digital signal for further processing and/or action. An ADC 88 coupled to the ADCIN2 connection 84c can convert the received combined VREF/FAULT signal 50 into a digital signal for further processing and/or action.

When the combined signal 50 provides the VREF voltage (i.e., in the absence of a fault detection), microcontroller 80 can process the sensor output signal 34 and the VREF voltage in a differential manner in order to remove errors attributable to reference voltage shifts and/or noise.

When the combined signal 50 indicates that a fault has been detected, microcontroller 80 can take protective action. For example, microcontroller 80 may put the sensor IC 20 into a safe state or safe mode of operation in which all or portions of the sensor are disabled or shut down to avoid excessive power dissipation and/or damage.

An optional level-shift circuit 70 can be provided to shift the voltage level of the combined signal 50 for coupling to an optional GPIO connection 84d of microcontroller 80. Level-shift circuit 70 can include a buffer or an inverter.

Illustrated level-shift circuit 70 operates as an inverter and includes a transistor 72, as may take the form of the illustrated NMOS, and a pull-up resistor 74. An output 78 of the level-shift circuit 70 is coupled to the GPIO connection 84d of microcontroller 80 for coupling to a digital input 90. In the presence of a fault detection, when the combined signal 50 is pulled low by transistor 48, transistor 72 of level-shift circuit 70 is turned off and the signal 78 is pulled up to VCC through pull-up resistor 74.

In some scenarios, the resulting combined signal 50 may not be at a level suitable to be quickly and accurately interpreted by the microcontroller 80 as a logic signal level. For example, in the case where a signal level of 1.65V is properly interpreted as a "logic high" by the microcontroller 80, then the additional GPIO pin 84d may be omitted if the microcontroller pin 84c has digital functionality. In this case, an interrupt may be set on a falling edge trigger on microcontroller pin 84c to indicate a fault. Thus, it will be appreciated by those of ordinary skill in the art however, that in systems in which the microcontroller 80 can accurately interpret the level of the combined signal 50, the level-shift circuit 70 could be omitted.

Figure 2:
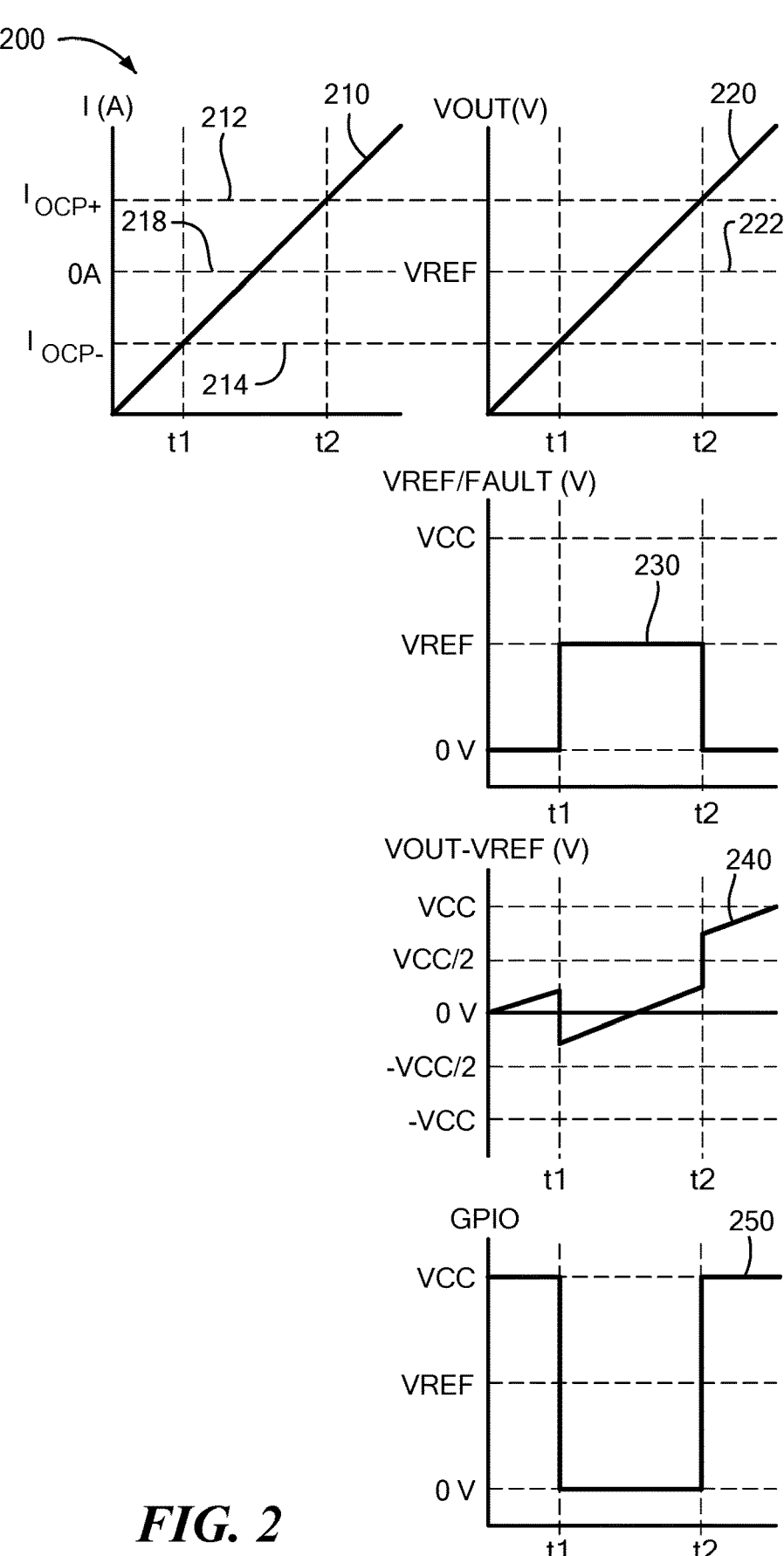
FIG. 2 shows several example waveforms associated with the sensor system of FIG. 1.

Referring also to FIG. 2, example waveforms 200 associated with sensor system 10 of FIG. 1 include a current waveform 210 representing an example current through conductor 14 and the resulting sensor output signal 220 that is indicative of the conductor current and may represent sensor output signal 34 of FIG. 1.

Example current 210 is shown in relation to positive and negative predetermined overcurrent threshold levels 212, 214, respectively. Thus, current 210 exceeding positive threshold level 212 as occurs after a time t2 or falling below negative threshold level 214 as occurs before a time t1 will cause fault detector 42 to indicate a fault condition.

Also shown in relation to the example conductor current 210 is the zero current level 218 associated with the quiescent reference voltage VREF 222 that is shown in relation to the sensor output signal 220.

Combined signal 230 can represent combined signal 50 of FIG. 1. Thus, when a fault is present prior to time t1 and after time t2, combined signal 230 is pulled low and between times t1 and t2 when no fault is detected, the combined signal 230 is at the VREF voltage level.

A differential voltage waveform 240 may represent a differential measurement by microcontroller 80. As mentioned above, microcontroller 80 can process the sensor output signal 34 and the VREF voltage in a differential manner in order to remove errors attributable to reference voltage shifts and/or noise.

A GPIO signal 250 may represent signal 78 of FIG. 1 as generated by level-shift circuit 70. Thus, signal 250 is an inverted version of combined signal 230, but with the reference voltage level VREF translated to logic voltage level VCC, as shown.

Microcontroller 80 can interpret signal 250 to determine that a fault is present before time t1 and after time t2, so that the differential measurement waveform 240 is not to be interpreted as an indication of the conductor current during these times. Whereas between times t1 and t2, microcontroller 80 can interpret differential measurement waveform 240 to be an accurate indication of the conductor current.

Figure 3:
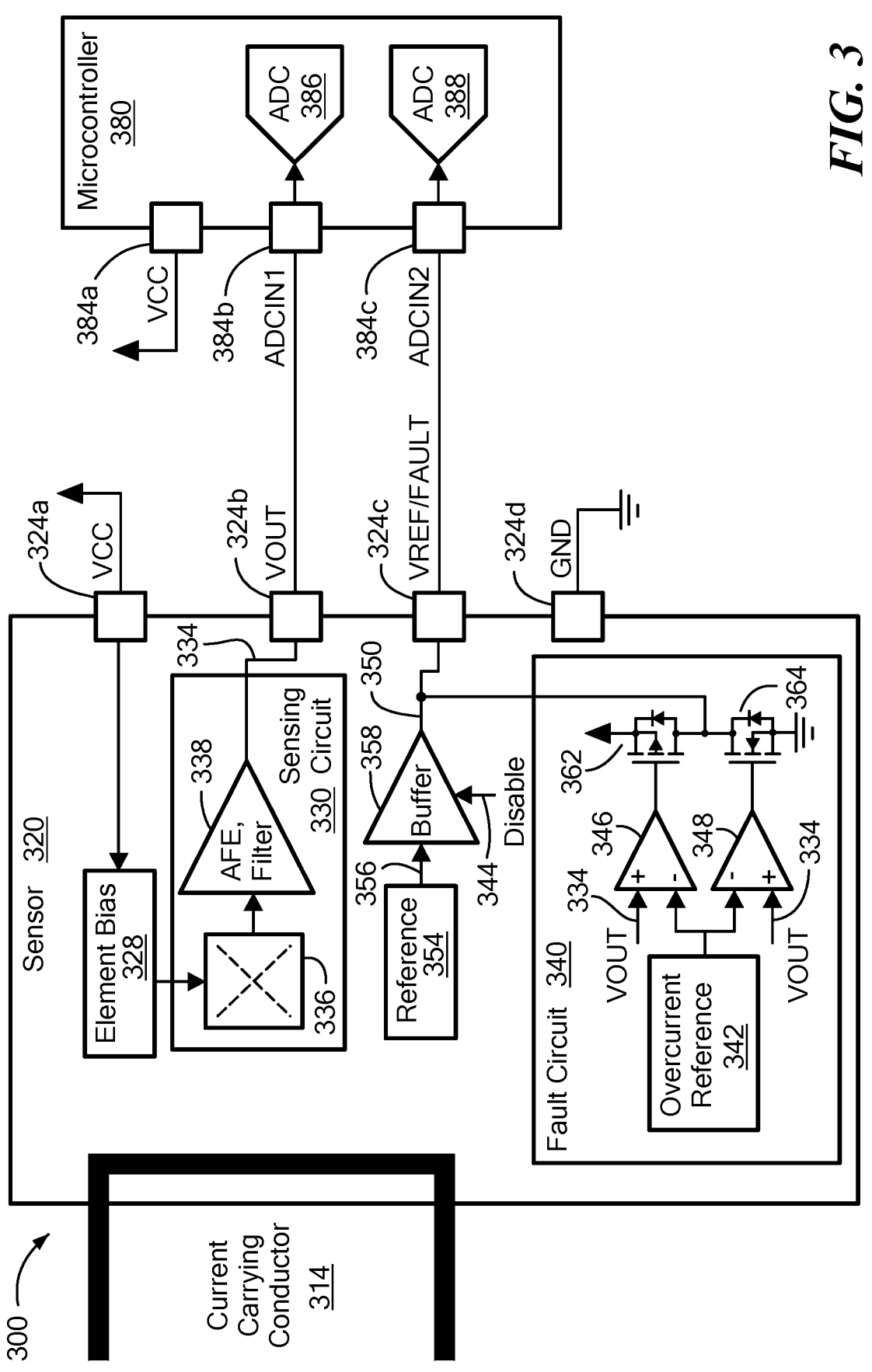
FIG. 3 is a block diagram of a sensor system including an alternative sensor having a combined fault signal and reference voltage connection according to the disclosure.

Referring also to FIG. 3, a sensor system 300 includes an alternative sensor IC 320 having a shared fault signal and reference voltage connection 324c at which a combined VREF/FAULT signal 350 is provided.

Sensor IC 320 is configured to generate a sensor output signal 334 that may be the same as or similar to output signal 34 of FIG. 1 and thus, that is indicative of a sensed parameter associated with a target 314. Example target 314 is an integrated current carrying conductor, as shown.

Sensor IC 320 differs from sensor IC 20 in fault circuit 340. In particular, fault circuit 340 is configured to provide a fault signal that can distinguish between more than one fault. To this end, fault circuit 340 can include a push-pull circuit that is configured to pull the combined signal 350 to a low level when a first fault is detected and pull the combined signal to a high level when a second fault is detected, as will be described.

In other respects, sensor IC 320 can be the same as or similar to sensor IC 20. To this end, sensor IC 320 includes a power connection 324a configured to receive a supply voltage VCC, a ground connection 324d, and a sensing circuit 330. Sensing circuit 330 has a reference voltage VREF represented by block 354 and is configured to generate the sensor output signal 334 at a sensor output connection VOUT 324b.

Sensing circuit 330 can include one or more sensing elements 336 coupled to processing circuitry 338. Sensing elements 336 can be Hall effect elements arranged to make a differential magnetic field measurement. A bias circuit 328 can provide bias current to the elements 336.

Processing circuitry 338 may include a front-end amplifier and/or a filter. Sensor output signal 334 can be an analog signal having a voltage level indicative of the current through conductor 314.

Reference voltage block 354 can generate a reference voltage 356 indicative of the quiescent voltage output for the sensor output VOUT. Reference voltage 356 can be buffered by a buffer 358. Generally, the reference voltage 356 is one-half of the VCC supply voltage level.

Fault circuit 340 can be configured to detect an overcurrent condition of the current conductor 314. To this end, circuit 340 includes a window comparator arrangement including comparators 346, 348, each of which compares the output signal 334 to an overcurrent reference 342. When the output signal 334 is greater than the overcurrent reference 342, the output of comparator 348 can transition to a high level to turn on NMOS transistor 364 in order to thereby pull up the combined signal 350 to a low level or ground; whereas, when the output signal 334 is less than the overcurrent reference 342, the output of comparator 346 can transition to a low level to turn on PMOS transistor 362 in order to thereby pull the combined signal 350 to a high level. In this way, in the presence of a first fault (e.g., a positive overcurrent fault), the combined signal 350 is pulled to ground and in the presence of a second fault (e.g., a negative overcurrent fault), the combined signal 350 is pulled to VCC.

Thus, the fault circuit 340 is bidirectional in that it detects a current level through conductor 314 that is greater than a predetermined positive current or less than a predetermined negative current; however, unlike the bidirectional overcurrent detection of FIG. 1, in FIG. 3, the resulting fault detection is different depending on which type of fault is detected.

In "normal" operation, when there is no fault detected by fault circuit 340, the combined signal 350 at shared output 324c provides the reference voltage VREF. In other words, when the sensor IC 320 is operating normally, the VREF/FAULT pin 324c will output the sensor reference voltage which is typically a voltage of approximately VCC/2.

In the case of a fault condition such as an overcurrent or short circuit condition, the reference buffer 358 is disabled and the VREF/FAULT pin 324c is pulled up through transistor 362 or down through transistor 364, depending on the particular fault condition, as described above. For example, when a fault occurs and is detected, a disable signal 344 can be provided to buffer 358 in order to disable the buffer. Disable signal 344 can be generated in various ways as a logical OR of the outputs of comparators 346, 348 so that when either comparator trips to thereby indicate the occurrence of a fault condition, the disable signal 344 changes state to disable the buffer 358.

It will be appreciated by those of ordinary skill in the art that disabling the reference buffer 358 can prevent unnecessary power dissipation associated with the buffer sinking current to ground and/or preventing damage to the buffer depending on the buffer design.

System 300 can further include an external microcontroller 380 with which sensor IC 320 communicates. Microcontroller 380 can be the same as or similar to microcontroller 80 except that a GPIO input need not be provided. This is because the configuration of fault circuit 340 effectively translates the combined signal 350 out of the normal operating range when a fault is detected and doing so facilitates interpretation of a fault condition by the microcontroller 380 as will become apparent from consideration of example waveforms in connection with FIG. 4.

Microcontroller 380 is configured to receive sensor output signal 334 at an ADCIN1 connection 384b and to receive the combined VREF/FAULT signal 350 at an ADCIN2 connection 384c. An ADC 386 coupled to the ADCIN1 connection 384b can convert the received sensor output signal 334 into a digital signal for further processing and/or action. An ADC 388 coupled to the ADCIN2 connection 384c can convert the received combined VREF/FAULT signal 350 into a digital signal for further processing and/or action.

When the combined signal 350 provides the VREF voltage (i.e., in the absence of a fault detection), microcontroller 380 can process the sensor output signal 334 and the VREF voltage in a differential manner in order to remove errors attributable to reference voltage shifts and/or noise.

When the combined signal 350 indicates that a fault has been detected, microcontroller 380 can take protective action. For example, microcontroller 380 may put the sensor IC 320 into a safe state or safe mode of operation in which all or portions of the sensor are disabled or shut down to avoid excessive power dissipation and/or damage.

Figure 4:
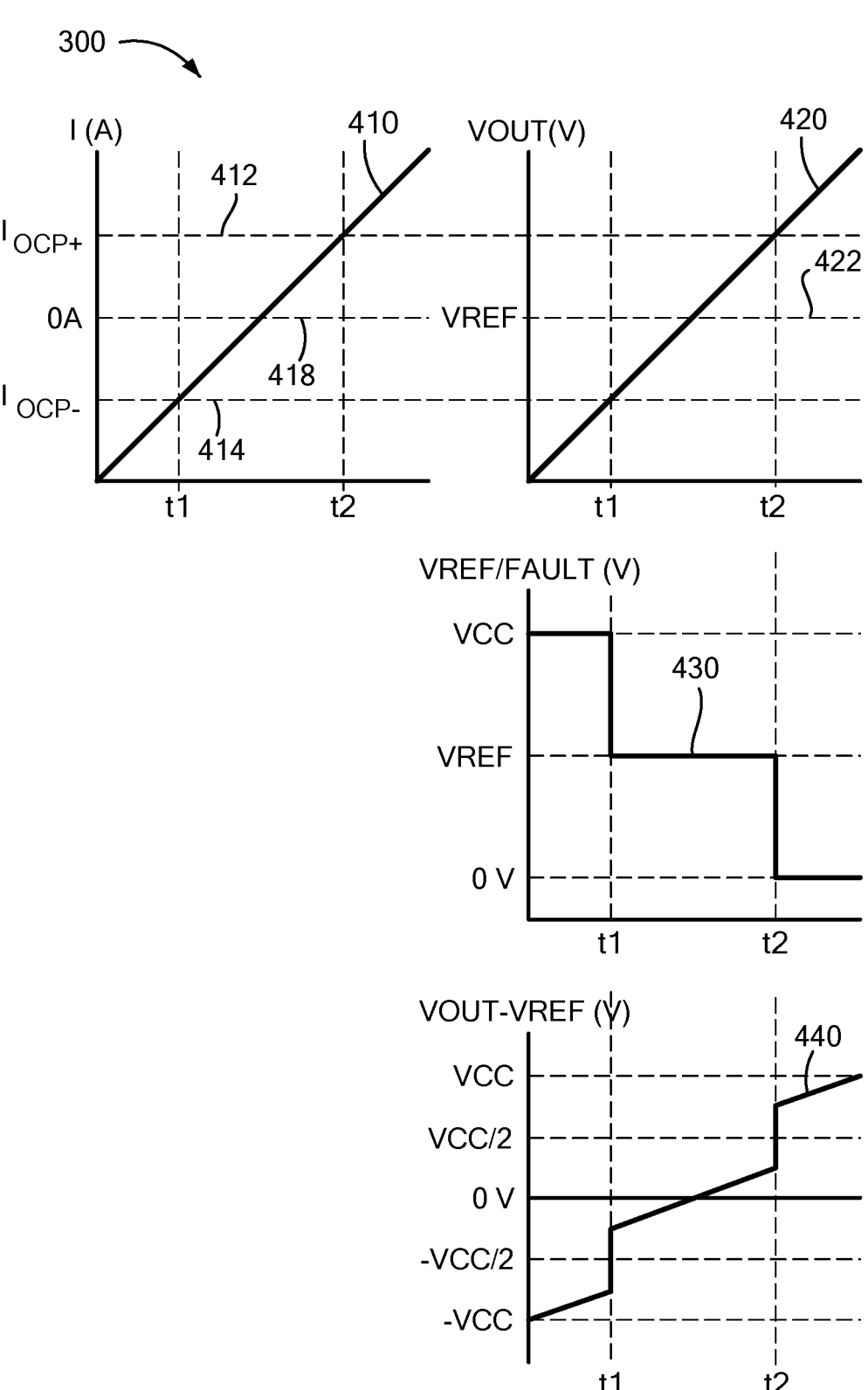
FIG. 4 shows several example waveforms associated with the sensor system of FIG. 3.

Referring also to FIG. 4, example waveforms associated with sensor system 300 of FIG. 3 include a current waveform 410 representing an example current through conductor 14 and the resulting sensor output signal 420 that is indicative of the conductor current and may represent sensor output signal 34 of FIG. 1.

Example current 410 is shown in relation to positive and negative predetermined overcurrent threshold levels 412, 414, respectively. Thus, current 410 exceeding positive threshold level 412 as occurs after a time t2 or falling below negative threshold level 414 as occurs before a time t1 will cause fault detector 340 to indicate a fault condition.

Also shown in relation to the example conductor current 410 is the zero current level 418 associated with the quiescent reference voltage VREF 422 that is shown in relation to the sensor output signal 420.

Combined signal 430 can represent combined signal 350 of FIG. 3. Thus, when a first fault is present prior to time t1, combined signal 430 is pulled high, when a second fault is present after time t2, combined signal 430 is pulled low, and between times t1 and t2 when no fault is detected, the combined signal 430 is at the VREF voltage level.

A differential voltage waveform 440 may represent a differential measurement by microcontroller 380. As mentioned above, microcontroller 380 can process the sensor output signal 334 and the VREF voltage in a differential manner in order to remove errors attributable to reference voltage shifts and/or noise.

Microcontroller 380 can interpret combined signal 430 to determine that a fault is present before time t1 and after time t2, so that the differential measurement waveform 440 is not to be interpreted as an indication of the conductor current during these times. Whereas between times t1 and t2, microcontroller 380 can interpret differential measurement waveform 440 to be an accurate indication of the conductor current.

As is apparent from consideration of the differential measurement signal 440, fault circuit 340 effectively operates to shift the VOUT-VREF signal 440 out of the normal range whenever a fault condition occurs. In this manner of providing three unique voltage ranges for the first fault occurring before time t1, for normal operation between times t1 and t2, and for the second fault occurring after time t2, interpretation ambiguity is eliminated and thus, interpretation of combined signal 430 by microcontroller 380 is facilitated without requiring a GPIO input like input 84d of FIG. 1.

It will be appreciated by those of ordinary skill in the art that in some embodiments, the first fault indicated by pulling the combined signal in one direction (e.g., low) can be an overcurrent fault and the second fault indicated by pulling the combined signal in the other direction (e.g., high) can be a different kind of fault such as a safety or overtemperature fault as non-limiting examples. It will be further appreciated that other fault circuitry can be implemented including fault circuitry that can detect more than two faults.

As used herein, the term "sensor" is used to describe a circuit that uses one or more sensing elements, generally in combination with other circuits. For example, the sensor can be a magnetic field sensor with one or more magnetic field sensing elements. The magnetic field sensor can be, for example, a rotation detector, a movement detector, or a proximity detector. A linear sensor can sense a magnetic field strength. A rotation detector (or movement detector) can senses passing target objects, for example, magnetic domains of a ring magnet or a ferromagnetic target (e.g., gear teeth) where the magnetic field sensor is used in combination with a back-bias or other magnet and can determine target movement speed. Also, linear arrangements of ferromagnetic objects are possible that move linearly.

As used herein, the term "magnetic field sensing element" is used to describe a variety of electronic elements that can sense a magnetic field. The magnetic field sensing element can be, but is not limited to, a Hall effect element, a magnetoresistance element, a magnetotransistor, or an inductive coil. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

As used herein, the terms "processor" and "controller" are used to describe elements that perform a function, an operation, or a sequence of operations. The function, operation, or sequence of operations can be hard coded into an electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory, in a discrete electronic circuit which can be analog or digital, and/or in special purpose logic circuitry (e.g., a field programmable gate array (FPGA)). Processing can be implemented in hardware, software, or a combination of the two. Processing can be implemented using computer programs executed on programmable computers/machines that include one or more processors, a storage medium or other article of manufacture that is readable by the processor (including volatile and non-volatile memory and/or storage elements), at least one input device and one or more output devices. Program code can be applied to data entered using an input device to perform processing and to generate output information. A processor or controller can contain internal processors or modules that perform portions of the function, operation, or sequence of operations. Similarly, a module can contain internal processors or internal modules that perform portions of the function, operation, or sequence of operations of the module.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship. As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

In the foregoing detailed description, various features of embodiments are grouped together in one or more individual embodiments for the purpose of streamlining the disclosure. This method of disclosure is not to be interpreted as reflecting an intention that the claims require more features than are expressly recited therein. Rather, inventive aspects may lie in less than all features of each disclosed embodiment. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A sensor integrated circuit configured to generate a sensor output signal indicative of a sensed parameter, comprising:
   a power connection configured to receive a supply voltage;
   a ground connection;
   a sensing circuit configured to generate the sensor output signal at a sensor output signal connection, wherein the sensing circuit has a reference voltage;
   a fault circuit comprising a fault detector configured to detect a fault and generate a fault signal indicative of the fault; and
   a combined connection at which a combined signal is provided, wherein the combined signal is indicative of the fault signal during times when the fault is detected and the reference voltage during times when the fault is not detected.

2. The sensor integrated circuit of claim 1 further comprising a reference buffer coupled to receive the reference voltage.

3. The sensor integrated circuit of claim 2 wherein the fault detector is further configured to generate a disable signal coupled to the reference buffer and configured to disable the reference buffer when a fault is detected.

4. The sensor integrated circuit of claim 1 wherein the fault signal is a digital signal having a low level when a fault is detected.

5. The sensor integrated circuit of claim 4 wherein the fault circuit further comprises a pull-down transistor controlled by the fault signal and configured to pull the combined signal to the low level when the fault is detected.

6. The sensor integrated circuit of claim 4 wherein the fault is a first fault and the fault detector is further configured to detect a second fault, and wherein the fault circuit further comprises a push-pull circuit controlled by the fault signal and configured to pull the combined signal to the low level when the first fault is detected and pull the combined signal to a high level when the second fault is detected.

7. The sensor integrated circuit of claim 1 wherein the fault is an overcurrent condition.

8. The sensor integrated circuit of claim 7 wherein the sensed parameter is a current flow through a conductor and the overcurrent condition is an overcurrent condition of the current flow through the conductor.

9. The sensor integrated circuit of claim 1 wherein the sensing circuit comprises a sensing element configured to generate a sensing element output signal and a processing path responsive to the sensing element output signal and configured to generate the sensor output signal.

10. The sensor integrated circuit of claim 9 wherein the sensing element comprises a magnetic field sensing element and the sensed parameter is a magnetic field.

11. The sensor integrated circuit of claim 9 wherein the processing path comprises a front-end amplifier coupled to receive the sensing element output signal and configured to generate an amplifier output signal.

12. The sensor integrated circuit of claim 1 wherein the reference voltage is at a voltage level of approximately one-half the supply voltage.

13. The sensor integrated circuit of claim 1 wherein the combined connection is configured for coupling to an external buffer or an external inverter to generate a level-shifted combined signal.

14. The sensor integrated circuit of claim 1 wherein the sensor integrated circuit has exactly four pins.

15. A method comprising:
  generating a sensor output signal indicative of a sensed parameter at a sensor output signal connection with a sensing circuit having a reference voltage;
  generating a fault signal indicative of a fault being detected; and
  generating a combined signal indicative of the reference voltage and the fault signal during times when the fault is detected and the reference voltage during times when the fault is not detected.

16. The method of claim 15 further comprising buffering the reference voltage with a reference buffer.

17. The method of claim 16 further comprising disabling the reference buffer when the fault is detected.

18. The method of claim 15 wherein generating the fault signal comprises generating a low level signal when the fault is detected.

19. The method of claim 18 wherein generating the combined signal comprises pulling the combined signal to the low level when a fault is detected.

20. The method of claim 18 wherein generating the fault signal comprises generating the fault signal indicative of a first fault or a second fault and wherein generating the combined signal comprises pulling the combined signal to the low level when the first fault is detected and pulling the combined signal to a high level when the second fault is detected.

21. The method of claim 15 wherein the fault comprises an overcurrent condition.

22. The method of claim 15 wherein the sensed parameter is a magnetic field associated with a current flow through a conductor and wherein generating the sensor output signal comprises sensing the magnetic field with a magnetic field sensing element.

* * * * *